United States Patent [19]

Griffith

[11] 4,255,670
[45] Mar. 10, 1981

[54] TRANSISTOR LOGIC TRISTATE OUTPUT WITH FEEDBACK

[75] Inventor: Paul J. Griffith, Portland, Me.

[73] Assignee: Fairchild Camera and Instrument Corp., Mountain View, Calif.

[21] Appl. No.: 5,928

[22] Filed: Jan. 24, 1979

[51] Int. Cl.³ .............. H03K 19/013; H03K 19/084; H03K 19/088
[52] U.S. Cl. ........................ 307/473; 307/299 B; 307/454
[58] Field of Search ............. 307/209, 213, 214, 215, 307/218, 299 B, 300

[56] References Cited

U.S. PATENT DOCUMENTS 4,081,695  3/1978  Allen et al. ..................... 307/209

OTHER PUBLICATIONS

Military Specification Microcircuits Mil-M-38510/3-09A (USAF), Jan. 4, 1978, pp. 44-71.
Low Power Schottky Data Book, "Circuit Characteristics," pp. 2-3 thru 2-7, copyright 1977, Fairchild Camera and Instrument Corp.

Primary Examiner—John Zazworsky
Attorney, Agent, or Firm—Paul J. Winters; Theodore S. Park; Ronald J. Meetin

[57] ABSTRACT

A TTL transistor logic tristate output device particularly suitable for common bus applications including transistor and diode means for feedback of a portion of current from any output load and from stray capacitances to drive the pulldown element to greater conduction and accelerate sinking of current from the output to ground during transition at the output from high to low potential, said transistor means also arranged to block paths from the output to ground through the enable gate when the output is in the high impedance third state. Means for blocking current flow from the output through the device to high potential is also described.

12 Claims, 9 Drawing Figures

TRANSISTOR LOGIC TRISTATE OUTPUT WITH FEEDBACK

FIELD OF THE INVENTION

This invention relates to a new and improved tristate output gate for transistor logic circuits affording accelerated switching between the states of the output and particularly suitable for integrated circuits and applications in which a plurality of logic circuits or gates are coupled at their outputs to a common bus.

BACKGROUND OF THE INVENTION AND PRIOR ART STATEMENT

In conventional transistor-transistor logic (TTL) and diode-transistor logic (DTL), logical values corresponding to binary "1" and "0" are represented by a high level voltage $V_{OH}$, for example greater than 2.5 volts and a low level voltage $V_{OL}$, for example less than 0.8 volts respectively. The high level binary "1" is derived from a voltage source $V_{cc}$ which sources current to the output when a binary "1" is to be delivered by the logic gate. When a binary "0" is required at the output, the logic gate "sinks" the current from the output load to a low level so that the low level voltage $V_{OL}$ appears at the output of the logic gate. Thus the typical TTL logic gate functions by "sourcing" and "sinking" current at the output according to whether a binary "1" (high level voltage) or a binary "0" (low level voltage) is the desired outcome of previously executed logical operations. In negative logic the representation of binary "1" and "0" by high and low level voltage is reversed.

A conventional TTL bistate output is illustrated in FIG. 1. Several elements or stages can be identified in such a TTL output gate. The "pullup" 11 for sourcing current from the higher level voltage $V_{cc}$ corresponding to binary "1" consists of transistors Q3 and Q4 forming a Darlington transistor current source coupled between the high level voltage source $V_{cc}$ and the output $V_{out}$. The "pulldown" element or stage 12 for sinking current and voltage from the output to ground consists of transistor Q2 with conventional squaring network transistor Q5 at its base. The phase splitter element or stage 13 consists of transistor Q1 which receives the data signal input to the gate in the form of a high or low level voltage at $V_{in}$ and controls the pullup and pulldown elements for either sourcing or sinking current at the output 14 as determined by the data signal input to the gate.

When a low level voltage appears at the input 15, a low voltage also appears at the base of phase splitter transistor Q1 and this transistor no longer conducts through its collector to emitter thereby turning off transistor Q2. The output $V_{out}$ of the gate is therefore isolated from ground. Because Q1 is nonconducting, the high level voltage $V_{cc}$ appears at the base of sourcing transistor Q3 permitting transistor Q3 to conduct to the base of Q4 which in turn becomes conducting and "sources" current from $V_{cc}$ to the output $V_{out}$. The TTL logic gate is therefore inherently inverting as a binary 0 at the input $V_{in}$ represented by voltage level $V_{OL}$ generates a binary 1 at the output represented by voltage level $V_{OH}$. When a binary 1 appears at the input, current from R8 supplies base drive to transistor Q1 and Q1 becomes conducting, sinking current from the base of Q3 and therefore turning off the Darlington transistor current source represented by transistors Q3 and Q4. Current from high level voltage $V_{cc}$ is therefore no longer sourced to the output. At the same time, pulldown transistor Q2 becomes conducting through its collector to emitter to ground as a result of the current supplied to its base and begins to discharge whatever load may be coupled to the output 14 of the gate. The speed at which transistor Q2 discharges the load drawing the output $V_{out}$ to the low level voltage $V_o$ depends on the base current delivered to Q2. That is, during switching while Q2 is in the linear range, the collector current of transistor Q2 equals $\beta$ times the base current where $\beta$ is the transistor current gain. During the transistion from high to low level voltage at the output 14, the pulldown element 12 must sink current not only from whatever load capacitance may be coupled at the output but also from the internal capacitance associated with the transistors and components themselves and also stray capacitance due to interconnections etc.

The speed at which the various capacitances are drained and the output voltage brought to low level, is therefore enhanced by diodes D1 and D2 indicated generally at 17. Diode D1 discharges the base of Q4 to the collector of transistor Q1 while diode D2 diverts some of the discharging load current to the collector of Q1. The increased emitter current of transistor Q1 becomes the base current to pulldown transistor Q2 thereby driving transistor Q2 harder, sinking current from the load and switching the output from binary 1 to binary 0 at a faster rate.

As shown in FIG. 1, some of the transistor and diode components are typically Schottky diodes and transistors indicated by the opposite square "hooks" in the schematic symbols. The Schottky clamping effected by an internal modification in these devices produces quicker turn-off during switching. A transistor logic output gate of the type illustrated in FIG. 1 while affording high speed switching by enhanced sinking of current during transition from high to low voltage at the output cannot provide the low impedance third state of tristate devices and is therefore unsuitable for coupling to a common bus where external voltages may be encountered.

The typical TTL tristate output gate is illustrated in FIG. 2 where components performing the same function as in the circuit FIG. 1 are similarly designated. Thus transistors Q3 and Q4 comprise the Darlington transistor current source or pullup element 11 performing the pullup function in sourcing current from $V_{cc}$ to $V_{out}$ when conducting. Transistor Q2 forms the pulldown element 12 sinking current from $V_{out}$ to ground when conducting. The phase splitter element 13 consisting of transistor Q1 similarly controls the pullup and pulldown elements for sourcing or sinking current at the output 14. The new element which has been added to the output gate of FIG. 2 in order to create a high impedance third state at $V_{out}$ is the enable gate 18 represented in part by transistor Q6. When the enable gate is conducting, base current from $V_{cc}$ to the Darlington transistor is diverted through the enable gate to ground. Similarly, the base current of phase splitter transistor Q1 finds a low impedance path to ground through diode D4 and the collector of enable gate transistor Q6. Ordinarily transistor Q6 is non-conducting so that the aforesaid routes to ground are blocked. In this condition, the output gate functions as a bistate output device in the manner described with reference to FIG. 1 except that feedback diodes D1 and D2 must be omitted for reasons which will hereinafter become apparent and the switching speed is slower between the high and low states. Thus, the drain of load and stray capacitances through the phase splitter collector cannot be used to drive the pulldown transistor Q2 to greater conduction to accelerate sinking of current and the transition from high to low voltage.

In order to establish a high impedance third state at $V_{out}$, the enable gate 18 is activated by a signal at the base of transistor Q6 so that it becomes conducting to ground. In this state, the enable gate effectively sinks all current to the elements of the output gate including the pullup and phase splitter stages (and therefore indirectly the pulldown element) by providing a direct route to ground. With all of the elements deprived of base current, the output effectively becomes a high impedance to any exterior circuitry. In this condition, the gate will neither source nor sink current at the output and will behave effectively as if nothing were there. Such a tristate device is therefore particularly applicable and suitable for applications in which a plurality of output gates are tied together or coupled to a common bus structure. In such common bus applications only one output, that is only one of the gates coupled to the bus structure, determines the voltage (high or low) of the bus while the other outputs for the remaining gates are in the high impedance third state.

A conventional enable gate 18 of the kind incorporated in FIG. 2 and illustrated in part by the transistor Q6 is shown more fully in FIG. 2A. As presented there, the full enable gate 18 is a bistate TTL output where transistor Q6 forms the pulldown element 20 with squaring circuit 21. The other elements include the pullup element 22, splitter 23 and enable control signal input 24.

The high speed switching characteristics of the bistate output gate with feedback diodes as illustrated in FIG. 1 are, however, sacrificed by adding the enable gate to achieve the tristate TTL output illustrated in FIG. 2. To explain this compromise more fully, reference is made to FIG. 3 in which the elements and benefits of both high speed switching and tristate output as taught by the prior art and presented in FIGS. 1 and 2 are sought to be combined. Thus, FIG. 3 includes all the elements and components of both FIGS. 1 and 2 with the corresponding designations and numbering. The problem arises in attempting to combine both the enable gate 18 which makes possible the high impedance third state and the feedback diodes 17 which drain load and component capacitance through the phase splitter 13 to the base of the pulldown transistor Q2, to accelerate switching. When the enable gate 18 is activated and transistor Q6 conducting to ground, diodes D1 and D2 afford a low impedance route directly from the output 14 through the enable gate to ground. Contrary to the desired result, the third state therefore still permits a low impedance path to ground at the output.

The foregoing account represents the closest prior art and state of the art pertinent to the present invention known to the inventor. In terms of published documentation, recent representative presentations exemplifying this prior art and state of the art in DTL and TTL bistate and tristate output technology are found in *MILITARY SPECIFICATION MICROCIRCUITS, DIGITAL, LOW POWER SCHOTTKY, TTL, DATA SELECTORS/MULTIPLEXERS, MONOLITHIC SILICON* MIL-M-38510/309A (USAF), 4 Jan. 1978, superceding MIL-M-38510/309 (USAF), 28 Feb. 1977, Rome Air Development Center, Department of the Air Force, (RADC) (RBRD), Griffiss AFB, NY 13341. Particularly pertinent to tristate output devices in this milspec are examples of commercial type microcircuits under designation numbers 54LS251 through 54LS258 and generally 54LS microcircuits illustrated at pages 44 through 71. Additional documentation of the prior art and state of the art known to the inventor and here presented can be found in current catalogs and data books of the commercial semiconductor microcircuit and integrated circuit manufacturers such as the *LOW POWER SCHOTTKY DATA BOOK* of Fairchild Camera and Instrument Corporation, 464 Ellis Street, Mountain View, California 94942, Copyright 1977. Pertinent portions for tristate output devices include the chapter "Circuit Characteristics" pp. 2-3 through 2-7 and applications to buffers, bus drivers and tristate outputs in the 54LS and 74LS series of 200 and greater beginning at page 5-187.

SUMMARY OF THE INVENTION

It is therefore an object of the present invention to provide a new and improved TTL tristate output gate or buffer which combines the advantages of high switching speed found in DTL and TTL bistate devices with the advantages of a high impedance third state found in tristate devices with enable gates. Another object of the invention is to provide a high speed tristate output device, buffer or gate suitable for applications in which a plurality of such output devices are coupled to a common bus and only one output drives the bus while the others remain in a high impedance third state. Thus, the invention seeks to provide tristate output devices and bus drivers which can attain a high impedance in the third state while retaining the advantages found in bistate output devices of high speed discharging of capacitive loads and stray capacitances during transition from the high level to low level voltage output.

In order to accomplish these results the present invention contemplates an improvement of the transistor logic tristate output device of the type comprising an input for binary data signals of high and low potential and an output, pullup means for sourcing current from high level potential to the output and output load, pulldown means for sinking current from the output and output load to low level potential, phase splitter means coupled to the input for controlling the pullup and pulldown means, and enable gate for sinking current to ground potential from the elements of the device to afford a high impedance third state at the output when the enable gate is activated. In particular, the invention contemplates integrating into such circuit, accelerating feedback transistor means coupled in parallel configuration with the phase splitter transistor means, said accelerating transistor means coupled through diode feedback means to the output of the tristate device without direct connection to the enable gate.

A feature and advantage of the arrangement contemplated by the present invention is that during transition at the output from a high to low level voltage or potential state representing a transition from binary 1 to binary 0 current is fed back from any load capacitance at the output and any stray capacitances of the components and interconnections through the accelerating transistor means to the base of the pulldown element to accelerate switching at the output. Yet, the arrangement of the invention prevents a route from output to ground through the enable gate when the output is in the high impedance third state and while the enable gate is otherwise sinking current to ground from the elements of the device.

More particularly and in the preferred embodiment, the invention contemplates a transistor logic tristate output device comprising an input for receiving binary data signals in the form of high and low potential states; an output for forcing high and low potential states to a load and for offering a high impedance third state; a pullup element comprising transistor means for sourcing current from the high potential to the output when the pullup transistor means is conducting; a pulldown element comprising transistor means for sinking current from the output to a low potential when the pulldown transistor means is conducting; and phase splitter means coupled between the data signal input on the one hand and the pullup and pulldown elements on the other hand for alternately controlling the conducting state or phase of the pullup and pulldown elements to alternately source and sink current at the output in accordance with binary data signals at the input. To attain the high impedance third state the invention provides enable gate means for sinking current from the elements of the device so that they are all non-conducting when the enable gate means is activated thereby to prevent either sinking or sourcing of current at the output by the pullup and pulldown elements whereby a high impedance third state is afforded at the output when the enable gate is actuated. According to the invention, there is also provided feedback transistor means coupled in parallel configuration with the phase splitter means, said feedback transistor means also coupled through one way diode means between the output and the pulldown element without a direct coupling to the enable gate whereby the feedback transistor means accelerates pulldown during transition from the high to low potential state at the output by feedback of current to the base of the pulldown transistor means from any load capacitance coupled to the output to drive the pulldown transistor to greater conduction during transition from the high to low state, while preventing a route to ground through the enable gate for any potential applied to the output while the device is in the high impedance third state. Accelerated shut off of the pullup element is also effected.

The invention contemplates a number of other features for adapting the TTL tristate output device for applications on a common bus. Thus, novel blocking diode means are provided at the high level potential source $V_{cc}$ so that in the event a voltage higher than the supply voltage $V_{cc}$ is applied to the output at the common bus, current cannot flow into the voltage supply. The invention is therefore particularly useful when interfacing to a CMOS circuit which has a higher input voltage than TTL supply voltage levels. It is also useful in "power down" applications on a common bus where the supply voltage $V_{cc}$ of one output device on the bus is lowered to conserve power.

In summary, the present invention contemplates for TTL tristate output devices the improvement comprising means for feedback of a portion of current from any output load and from stray capacitances to drive the pulldown element and accelerate sinking of current from the output during transition at the output from the high to low potential said means also blocking paths from output to ground through the enable gate when the output is in the high impedance third state. Means for blocking current flow from the output through the device to high potential in the event a higher voltage is applied to the output is also contemplated. Other objects, features and advantages of the invention will become apparent in the following specification and accompanying drawings.

BRIEF DESCRIPTION OF THE DRAWINGS

FIG. 5 is a schematic circuit diagram illustrating an application of the invention in a non-inverting output logic gate while

FIG. 6 is a schematic circuit diagram illustrating an application of the present invention in an inverting output logic gate while

DESCRIPTION OF THE PREFERRED EMBODIMENT

Figure 1:
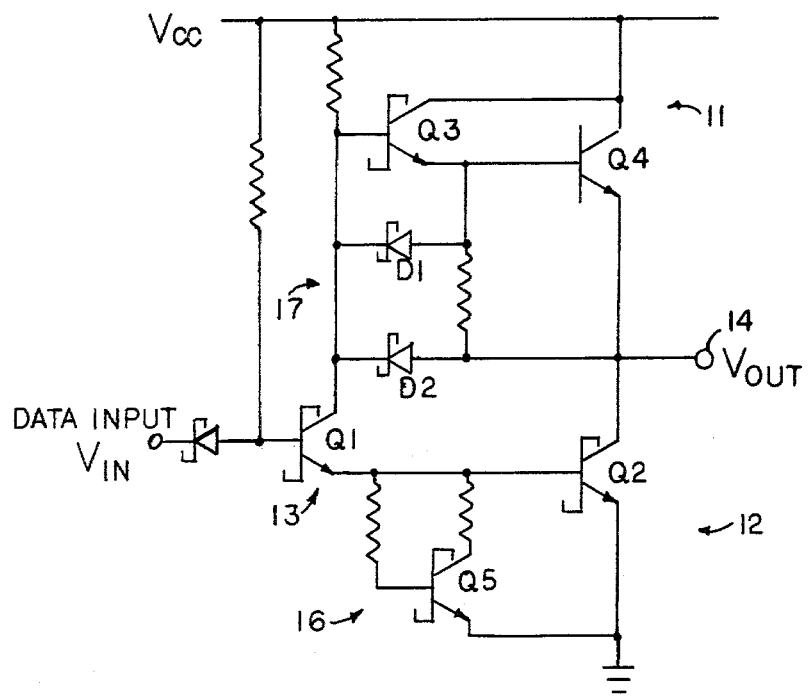
FIG. 1 is a schematic circuit diagram of a conventional prior art TTL bistate output device.
Figure 2:
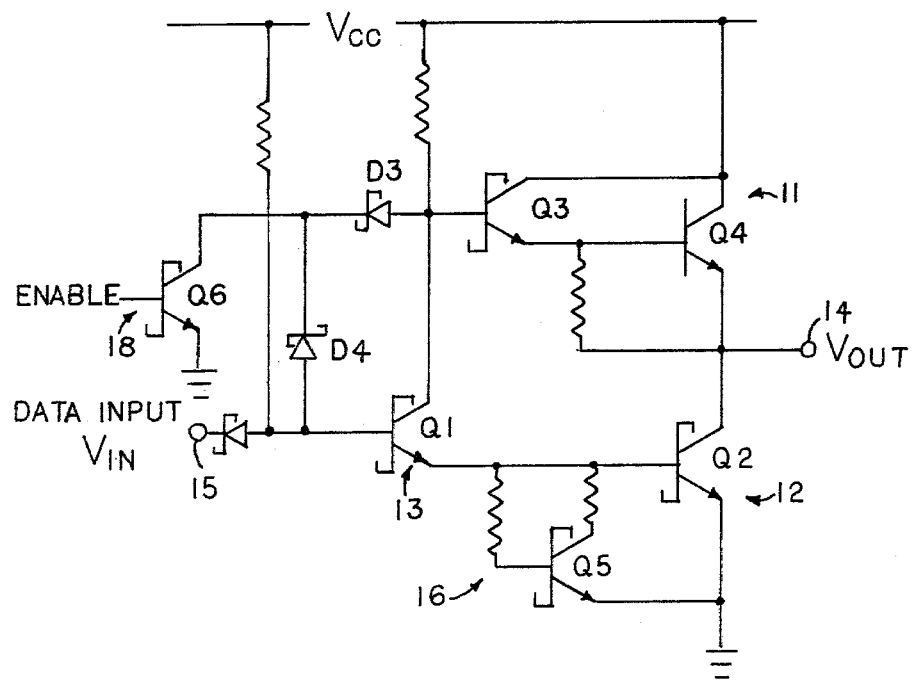
FIG. 2 is a schematic circuit diagram of a conventional prior art tristate output device.
Figure 2A:
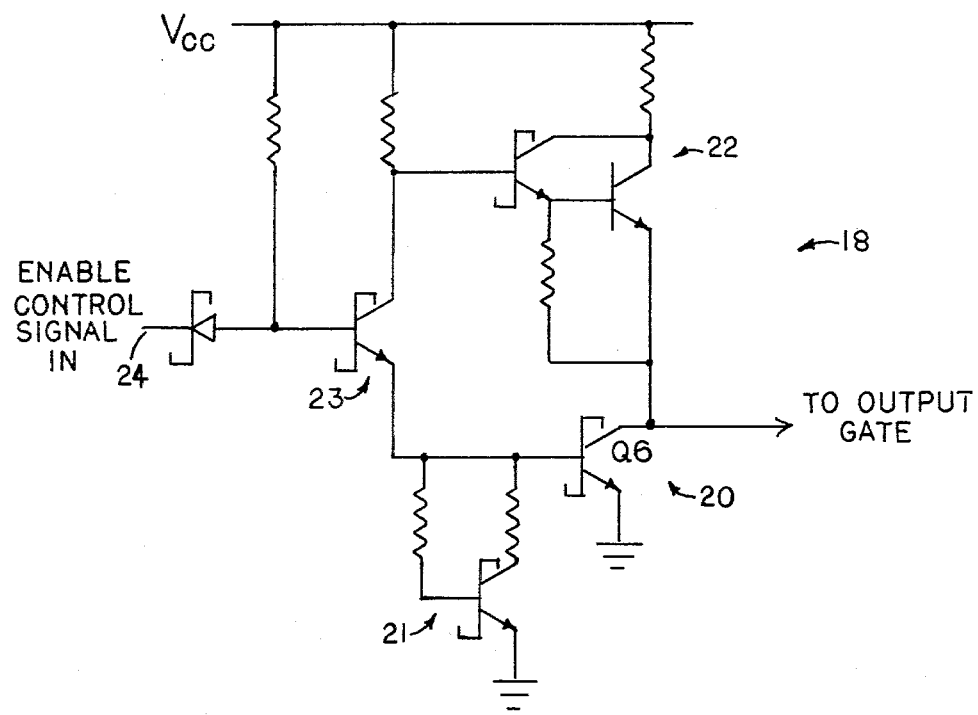
FIG. 2A is a schematic circuit diagram of a complete enable gate for a TTL tristate output device as illustrated in FIG. 2.
Figure 3:
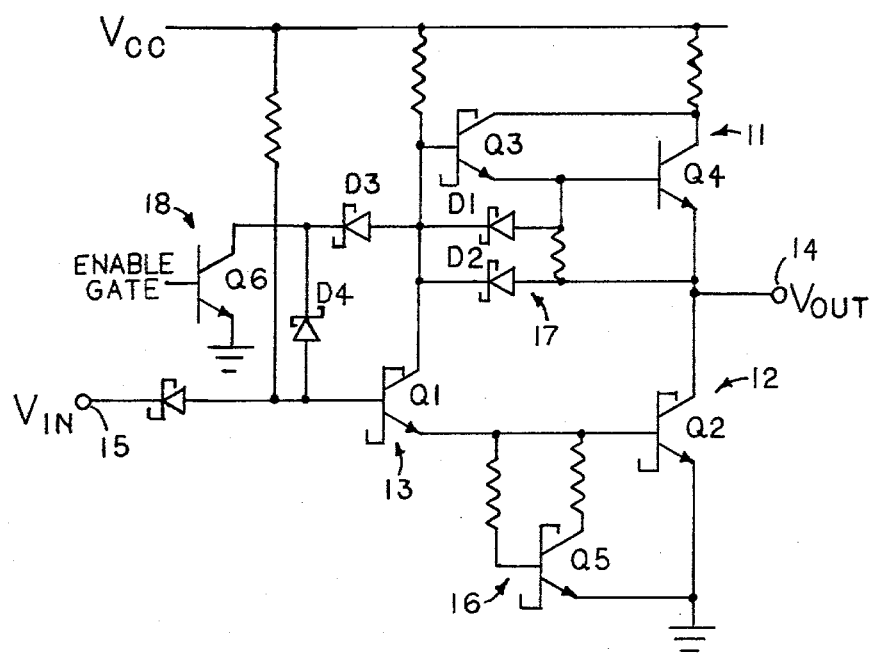
FIG. 3 is a schematic circuit diagram of an inoperative TTL output device resulting from state of the art combination of the circuits of FIGS. 1 and 2.
Figure 4:
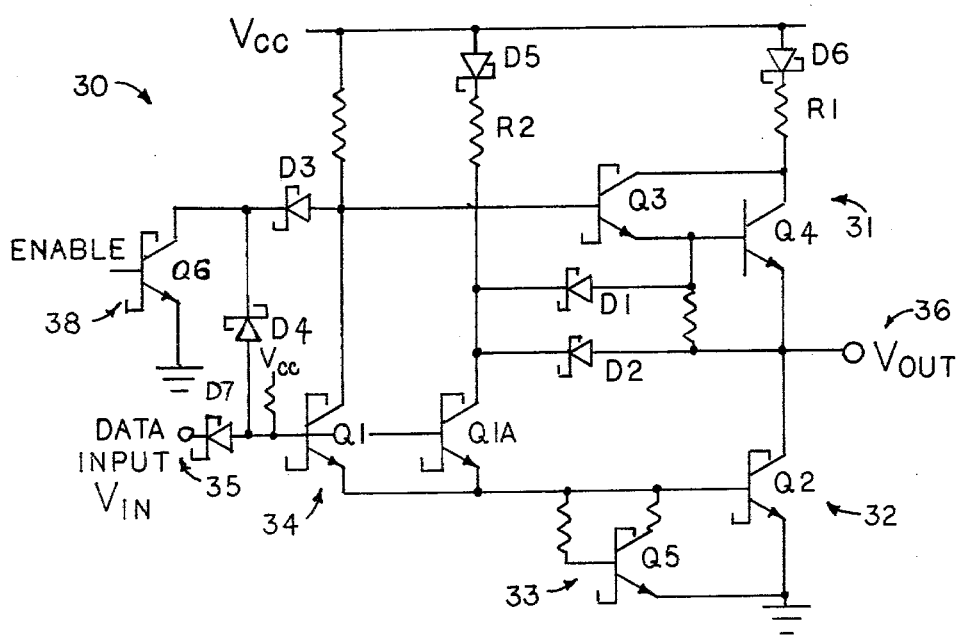
FIG. 4 is a schematic circuit diagram of a TTL tristate output device combining the features of a high impedance third state with high speed switching in accordance with the present invention.

In the preferred embodiment of the present invention illustrated in FIG. 4, there is provided a TTL tristate output device 30 including a Darlington transistor current source pullup element 31 consisting of transistors Q3 and Q4 and pulldown element 32 consisting of transistor Q2 with squaring network 33 consisting of transistor Q5. The pullup and pulldown elements function in the manner heretofore described for sourcing current from the high voltage supply $V_{cc}$ to the output $V_{out}$ or sinking current from the output to ground. The transistor and diode components of the TTL tristate output device 30 that function in the manner previously described with reference to the state of the art TTL output devices appear with corresponding designations. Thus, in addition to the pullup and pulldown elements there is also a phase splitter element 34 consisting of transistor Q1 which receives base current according to the level of the data input voltage signal. When conducting in response to high level voltage binary 1 at the input 35, phase splitter transistor Q1 becomes conducting diverting current from the bases of and turning off the pullup transistors Q3 and Q4 while turning on transistor Q2. As a result, current from the high voltage supply $V_{cc}$ is blocked from the output $V_{out}$ 36 while the pulldown transistor Q2 sinks current from the output, lowering $V_{out}$ to low level potential $V_{ol}$ corresponding to binary 0 at the output. Just the reverse occurs when a low level voltage or binary 0 appears at the input 35. Diode D7 diverts current from the phase splitter transistor Q1. Phase splitter transistor Q1 turns off, turning off the pulldown transistor Q2 and permitting pullup transistors Q3 and Q4 to conduct, sourcing current from the high level voltage $V_{cc}$ to the output $V_{out}$ resulting in a high level output $V_{oh}$.

There is also provided an enable gate 38 including transistor Q6 which functions in the manner heretofore described to divert current from the bases of all the elements of the output gate when a signal at the enable gate transistor causes it to conduct. When the enable gate is conducting the high impedance third state of the tristate output device appears at the output 36 because the device is able neither to source current to the output from voltage supply $V_{cc}$ through transistor Q4 nor sink current from the output to ground through transistor Q2. When the enable gate is non-conducting, the device continues to operate effectively as a bistate device alternating output levels between high and low according to whether the device is sourcing or sinking current at the output. Diodes D3 and D4 coupled between the device and the collector circuit of the enable gate pulldown transistor Q6 prevent sourcing of current from the enable gate.

In accordance with the invention, additional components are integrated into the TTL tristate output device in order to combine the features of a high impedance third state with the high speed switching from high to low level at the output heretofore only attainable with bistate devices. Thus, feedback transistor Q1A is coupled into the circuit in a parallel configuration with phase splitter transistor Q1 such that the bases and emitters are respectively coupled together. This parallel tying of bases and emitters results in a component coupling referred to as current mirror configuration.

However, while the collector of phase splitter transistor Q1 is coupled to the base of pullup transistor Q3 and the enable gate 38, the collector of feedback and accelerator transistor Q1A follows different paths. First, the collector of feedback transistor Q1A is coupled to the output through diode D2 oriented for feedback of current from the load to the base of transistor Q2 when transistor Q1A is conducting. It is also coupled through diode D1 to the base of pullup transistor Q4 to hasten discharge and turnoff of this transistor.

Thus, during transition from high to low state at the output, both phase splitter transistor Q1 and feedback transistor Q1A are conducting due to the high level signal at the input. Furthermore, the emitter currents out of both transistors feed the base of pulldown transistor Q2 so that it is sinking current from the output 36 through the collector of Q2 to ground potential. The feedback and accelerating function of transistor Q1A is now apparent. Additional load capacitance and stray capacitance at the output require an initial flow of current to draw down the output, greater than that required to maintain the output at a steady state low level once it is pulled down. This initially greater sinking current is facilitated by the feedback transistor Q1A which feeds back some of the load and stray capacitance drainage current received by way of diodes D1 and D2 coupled to the output. This feedback current is delivered through the collector of the feedback accelerator transistor Q1A to the base of pulldown transistor Q2 thereby driving the pulldown transistor to greater conduction, discharging and sinking the surge of current from the output load and stray capacitances to ground or low potential much faster. It is in this respect that transistor Q1A comprises a newly integrated feedback and accelerator element in the circuit. By this expedient a faster high to low transition is achieved.

Furthermore, this feedback of current from the output is not achieved by sacrifice of the high impedance third state otherwise available when the enable gate is activated. This is so because unlike the collector of phase splitter transistor element Q1, the collector feedback and accelerator transistor Q1A is not coupled to the enable gate. Rather, it is tied directly through a resistance to the high level voltage supply $V_{cc}$, without connection to the enable gate or the base of pullup transistor Q3. It is only transistor Q1 that performs the phase splitting function and which therefore must be tied to the collector of pullup transistor Q3 and consequently the enable gate. When the enable gate 38 is activated and transistor Q6 is conducting to ground sinking base current from Q3, Q1 and Q1A, no route or path to ground is available from the output through diodes D1 and D2 as they are tied only to the collector of Q1A and not the collector of Q1. In the high impedance third state with the base current diverted from all transistors, no transistor is conducting and any voltage applied to the output sees only a high impedance and the output can be pulled to any voltage without sinking or sourcing current.

The invention also contemplates integration of further novel features to prevent flow back of current into the voltage supply $V_{cc}$ in the event a voltage higher than $V_{cc}$ is externally applied to the output. As illustrated in FIG. 4, blocking diodes D5 and D6 are included in the collector coupling to high voltage supply $V_{cc}$ for transistors Q1A and Q3 and Q4. These diodes are oriented to source current from the supply $V_{cc}$ to the collectors but block any flow of current backward into the supply. The circuit from $V_{cc}$ through diode D6 and current limiting resistor R1 to the collector of Q3 and Q4 provides the path for sourcing current to the output in the high state.

The circuit from $V_{cc}$ through diode D5 and bias resistor R2 to the collector of Q1A provides the steady state collector current for feedback transistor Q1A which is tied in current mirror configuration with the phase splitter transistor Q1. According to this current mirror configuration, the bases and emitters of Q1 and Q1A are tied together and according to Kirchoff's Law the voltage across both base emitter junctions must be equal. The base-emitter voltage is determined by the current density of the emitter and therefore the emitter current densities must be equal. To keep the current densities equal Q1A must have a steady state collector current which is afforded by the coupling of the collector of Q1A through resistor R2 to the voltage supply $V_{cc}$. Transistors Q1 and Q1A can therefore both saturate and equalize in the steady state of the low level output after the sinking of a large current through Q1A during the high to low transition.

Figure 5:
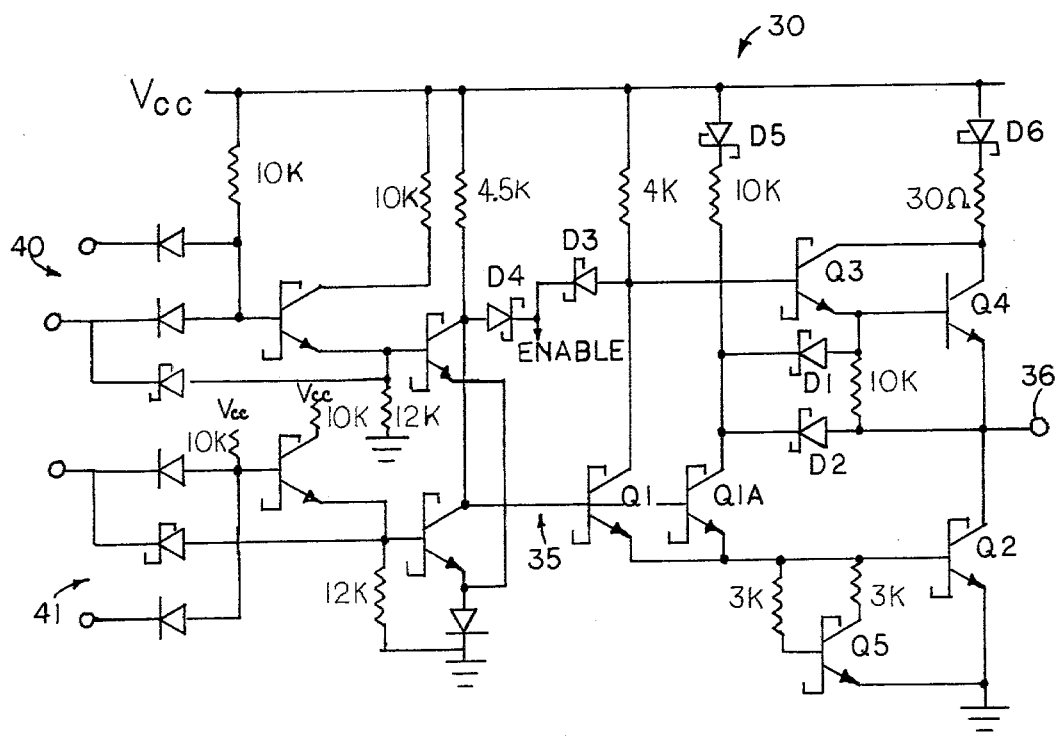
Figure 5A:
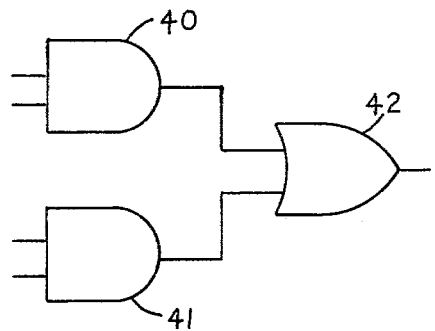
FIG. 5A is a logic diagram of the logic functions performed by the circuit of FIG. 5.
Figure 6A:
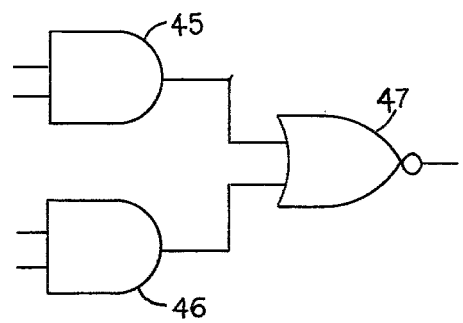
FIG. 6A is a logic diagram of the logic functions performed by the circuit of FIG. 6.
Figure 6:
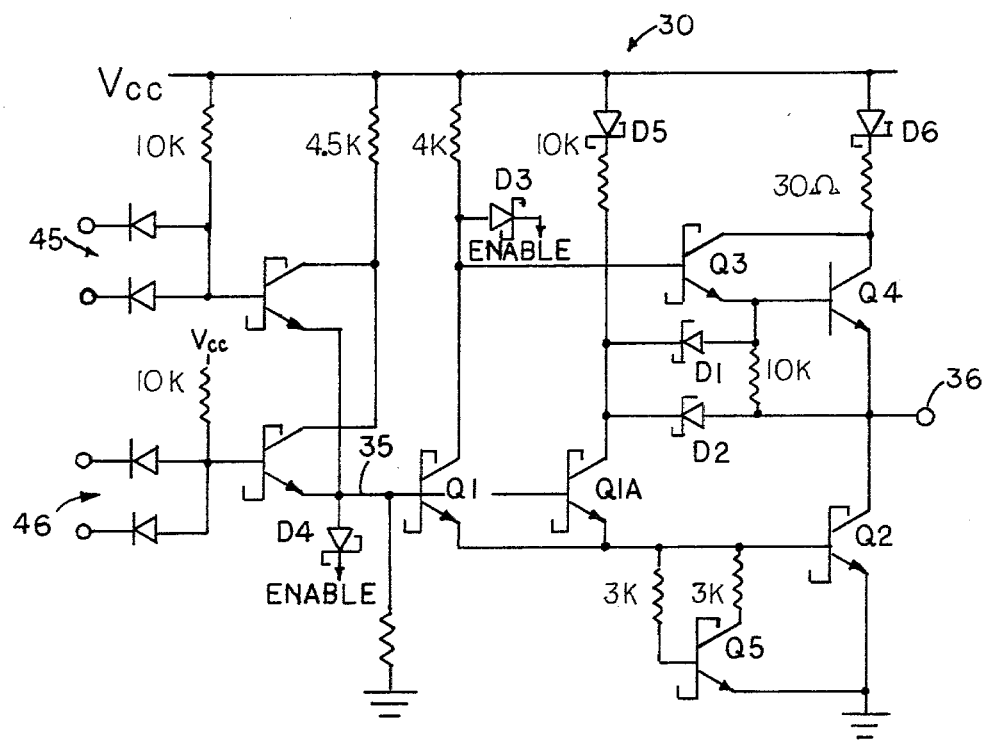

Two applications of the TTL tristate output device described with reference to FIG. 4 are illustrated in FIGS. 5 and 6. In these figures, the output device components and elements corresponding to those described with reference to FIG. 4 are given the same letter and numeral designations, and function in the same manner so that repetition of the description of operation of those components and elements is unnecessary. Generally, in FIG. 5, the input 35 to the TTL tristate output device 30 is coupled to a pair of logic "and" gates 40 and 41 so that a high level signal or binary 1 from either "and" gate will produce a low level voltage or binary 0 at the input 35 of the tristate output device 30. The two "and" gates are therefore coupled to the tristate device through an "or" coupling and the input to the tristate is inverted. The tristate device inherently inverts the signal once again to provide a high level or binary 1 at the final output 36. The overall logical result of the two inversions is a non-inverting output of two "and" gates 40 and 41 into an "or" gate 42 as illustrated in FIG. 5A.

Generally in FIG. 6, the input 35 to TTL tristate output device 30 is coupled to a pair of "and" gates 45 and 46 so that a high level signal or binary 1 from either "and" gate will produce a high level voltage or binary 1 at the input 35 of the tristate device 30. The two "and" gates are therefore coupled to the input of the tristate device through an "or" coupling and the signal is not inverted. The tristate device inherently inverts the signal to provide a low level or binary 0 at the final output 36. The overall logical result is an inverting output of two "and" gates 45 and 46 into an inverting "or" gate or "nor" gate 47, as illustrated in FIG. 6A.

Component designations for the applications of the invention illustrated in FIGS. 5 and 6 include typical values for the resistors illustrative of specific examples of the "best mode" embodiment. Transistors are of the NPN type either regular or Schottky-clamped as required in TTL logic with diodes of the PN type either regular or Schottky-clamped, all fabricated according to the well known and well documented produces of solid state integrated circuit technology. Typical circuit characteristics and design considerations for these components are found, for example, in the Fairchild *Low Power Schottky Data Book* referred to above.

I claim:

1. In a transistor logic tristate output device of the type comprising an input and an output for binary data signals of high and low potential, pullup element for sourcing current to the output and output load from high potential, pulldown element for sinking current from the output and output load to low potential, phase splitter element coupled at the input to control the pullup and pulldown elements, and an enable gate for sinking current from the elements of the device to afford a high impedance third state at the output when the enable gate is activated, the improvement comprising:

means for feedback of a portion of current from any output load to drive the pulldown element and accelerate sinking of current from the output during transition at the output from high to low potential, said means also blocking paths from output to ground through the enable gate when the output is in the high impedance third state, said means for feedback coupled in parallel configuration with the phase splitter element.

2. A transistor logic tristate output device as set forth in claim 1 wherein is also included the improvement comprising separate and additional means blocking current flow from the output through the device to high potential in the event a higher voltage is applied to the output.

3. In a transistor logic tristate output device of the type comprising an input and an output for binary data signals of high and low potential, pullup element for sourcing current to the output and output load from high potential, pulldown element for sinking current from the output and output load to low potential, phase splitter element coupled at the input to control the pullup and pulldown elements, and an enable gate for sinking current from the elements of the device to afford a high impedance third state at the output when the enable gate is activated, the improvement comprising:

feedback transistor means coupled in parallel with the phase splitter element said feedback transistor means coupled through one way diode means between the output and pulldown element for feedback of current from any output load to accelerate pulldown during transition at the output from high to low potential said feedback transistor means coupled in the device without connection to the enable gate thereby preventing a route from output to ground through the enable gate when the output is in the high impedance third state.

4. A transistor logic tristate output device as set forth in claim 3 wherein said feedback transistor means is also coupled through one way diode means between the pullup element and the pulldown element to accelerate turnoff of the pullup element to a non-conducting state during transition of the output from high to low potential while preventing a route from output to ground through the enable gate when the output is in the high impedance third state.

5. A transistor logic tristate output device as set forth in claim 3 wherein is also included diode means coupled between the feedback transistor means and high potential and between the pullup element and high potential for blocking current flow from the output through the device to high potential in the event a voltage higher than the high potential is applied to the output.

6. In a transistor logic tristate output device of the type comprising an input for receiving binary data signals in the form of high and low potential states, a pullup element comprising transistor means for sourcing current from a high potential when the transistor means is conducting, a pulldown element comprising transistor means for sinking current to a low potential when said transistor means is conducting, phase splitter element comprising transistor means coupled between the data signal input on the one hand and the pullup and pulldown elements on the other hand for alternately controlling the conducting state of said pullup and pulldown elements for either sourcing or sinking current in accordance with binary data signals at the input, an output coupled between the pullup and pulldown elements for delivering either high or low potential to a load according to whether the pullup or pulldown element is conducting, enable gate means for sinking current from the elements of the device so that they are all non-conducting when the enable gate means is activated thereby to prevent either sinking or sourcing of current at the output by the pullup and pulldown elements whereby a high impedance third state is afforded at the output when the enable gate is activated, the improvement comprising:

feedback transistor means coupled in current mirror configuration with the phase splitter element transistor means, said feedback transistor means coupled through one way diode means to the output and without a direct connection to the enable gate whereby the feedback transistor means accelerates pulldown during transition from the high to low state by feedback of current from any load coupled to the output to drive the pulldown element transistor means to greater conduction during transition from the high to low state while blocking paths to ground through the enable gate for any potential applied to the output while the device is in the high impedance third state.

7. A transistor logic tristate output device comprising:

an input for receiving binary data signals in the form of high and low potential states;

a pullup element comprising transistor means for sourcing current from a high potential when the transistor means is conducting;

a pulldown element comprising transistor means for sinking current to a low potential when said transistor means is conducting;

phase splitter element comprising transistor means coupled between the data signal input on the one hand and the pullup and pulldown elements on the other hand for alternately controlling the conducting state of said pullup and pulldown elements for either sourcing or sinking current in accordance with binary data signals at the input;

an output coupled between the pullup and pulldown elements for delivering either high or low potential to a load according to whether the pullup or pulldown element is conducting;

enable gate means for sinking current from the elements of the device so that they are all non-conducting when the enable gate means is activated thereby to prevent either sinking or sourcing of current at the output by the pullup and pulldown elements whereby a high impedance third state is afforded at the output when the enable gate is activated;

feedback transistor means coupled in current mirror configuration with the phase splitter element transistor means, said feedback transistor means coupled through one way diode means to the output without direct connection to the enable gate whereby the feedback transistor means accelerates pulldown during transition from the high to low state by feedback of current from any load coupled to the output to drive the pulldown element to greater conduction during transition from the high to low state while blocking paths to ground through the enable gate for any potential applied to the output while the device is in the high impedance third state;

and diode blocking means for blocking current flow from the output through the device to high potential in the event a higher voltage is applied to the output.

8. A transistor logic tristate output device as set forth in claim 7 wherein the feedback transistor means is also coupled to the pullup element to accelerate shutoff of the pullup element transistor means during transition from high to low state at the output.

9. A transistor logic tristate output comprising:

an input for receiving binary data signals comprising high and low potential states;

an output for delivering high and low potential states and for offering a high impedance third state;

a pullup element comprising transistor means for sourcing current from a higher potential state to the output when the transistor means is conducting;

a pulldown element comprising transistor means for sinking current from the output to a lower potential state when said transistor means is conducting;

said output coupled between the pullup and pulldown elements for delivering either the higher or lower potential to a load according to whether the pullup or pulldown element is conducting;

phase splitter element comprising transistor means coupled between the data signal input on the one hand and the pullup and pulldown elements on the other hand for alternately controlling the conducting state or phase of the pullup and pulldown elements to alternately source or sink current at the output in accordance with binary data signals at the input;

enable gate means for sinking current from the elements of the device so that they are all non-conducting when the enable gate means is activated, thereby to prevent either sinking or sourcing of current at the output by the pullup and pulldown elements whereby a high impedance third state is afforded at the output when the enable gate is activated;

feedback transistor means coupled in parallel current mirror configuration with the phase splitter transistor means said feedback transistor means also coupled through one way diode means to the output without a direct coupling to the enable gate whereby the feedback means accelerates pulldown during transition from the high to low state at the output by feedback of current from any load coupled to the output to drive the pulldown element transistor means to greater conduction during transition from the high to low state, while preventing a route to ground through the enable gate for any potential applied to the output while the device is in the high impedance third state;

said feedback transistor means also coupled through one way diode means to the pullup element to accelerate shutoff of the pullup element transistor means further to accelerate transition from high to low state at the output;

and diode blocking means for blocking current flow from the output through the device to high potential in the event a higher voltage is applied to the output.

10. A transistor logic tristate output device comprising:

an input for receiving binary data signals in the form of high and low potential states;

an output for delivering high and low potential states to a load and for offering a high impedance third state;

a pullup element comprising transistor means for sourcing current from a high potential state to the output when the transistor means is conducting, the collector means of the pullup element coupled to a high potential source and the emitter means coupled to the output;

a pulldown element comprising transistor means for sinking current from the output to a low potential source when said transistor means is conducting, the collector means of the pulldown element coupled to the output and the emitter means coupled to the low potential source;

a phase splitter element comprising transistor means coupled between the data signal input on the one hand and the pullup and pulldown elements on the other hand for alternately controlling the conducting state or phase of the pullup and pulldown elements to alternately source or sink current at the output in accordance with binary data signals at the input, the base means of said phase splitter element coupled to the input, the collector means of said phase splitter element coupled to the base means of the pullup element and the high potential source, and the emitter means of said phase splitter element coupled to the base means of the pulldown element;

accelerating transistor means coupled in parallel configuration with the phase splitter element with common base and emitter means couplings, the collector means of said accelerating transistor means coupled to the high potential source, and through one way diode means to the output;

enable gate element comprising transistor means for sinking current from the elements of the device so that they are all non-conducting when the enable gate means is activated, thereby to prevent either sinking or sourcing of current at the output by the pullup and pulldown elements whereby a high impedance third state is afforded at the output when the enable gate is activated, the collector means of said enable gate transistor sinking means coupled through one way diode means to the collector means of the phase splitter element and the base means of the pullup element, and through one way diode means to the base means of the phase splitter element and the base means of the accelerating transistor means;

whereby the accelerating transistor means accelerates pulldown during transition from the high to low state at the output by sinking current from any load coupled to the output and driving the pulldown element to greater conduction while preventing a route to ground through the enable gate for any potential applied to the output while the device is in the high impedance third state and the enable gate is activated sinking current from the elements of the device.

11. A transistor logic tristate output device as set forth in claim 10 wherein the collector means of the accelerating transistor means is also coupled through one way diode means to the base means of the pullup element thereby accelerating turnoff of the pullup element to a non-conducting state during transition of the output from high to low potential while preventing a route from the output to ground through the enable gate when the output is in the high impedance third state.

12. A transistor logic tristate output device as set forth in claim 10 wherein the collector means of both the accelerating transistor means and the pullup element are coupled to the high potential source through one way diodes so that current cannot flow into the high voltage supply in the event a higher voltage is applied to the output of the device.

* * * * *